United States Patent [19]
Reyes

[11] Patent Number: 5,639,683
[45] Date of Patent: Jun. 17, 1997

[54] STRUCTURE AND METHOD FOR INTERGRATING MICROWAVE COMPONENTS ON A SUBSTRATE

[75] Inventor: Adolfo Canuto Reyes, Chandler, Ariz.

[73] Assignee: Motorola, Inc., Schaumburg, Ill.

[21] Appl. No.: 347,931

[22] Filed: Dec. 1, 1994

[51] Int. Cl.$^6$ .............. H01L 21/70; H01L 27/00; H01L 21/60
[52] U.S. Cl. .............. 437/60; 437/209
[58] Field of Search .............. 437/209, 60, 205; 333/246, 247; 228/180.21, 180.22; 257/728, 735, 736, 737, 738, 777, 778

[56] References Cited

U.S. PATENT DOCUMENTS

| | | | |
|---|---|---|---|
| 4,672,421 | 6/1987 | Lin | 357/80 |
| 4,721,995 | 1/1988 | Tanizawa | 257/777 |
| 5,063,177 | 11/1991 | Geller et al. | 437/209 |
| 5,105,172 | 4/1992 | Khatibzadeh et al. | 333/175 |
| 5,138,436 | 8/1992 | Koepf | 357/74 |
| 5,198,963 | 3/1993 | Gupta et al. | 361/386 |
| 5,426,319 | 6/1995 | Notani | 257/275 |
| 5,446,309 | 8/1995 | Adachi et al. | 257/777 |

OTHER PUBLICATIONS

Sakai et al., "A Novel Millimeter–Wave IC on Si Substrate using Flip–chip Bonding Technology", IEEE MTT–S International Microwave Symposium Digest, vol. 3, May 23–27, 1994, pp. 1763–1766.

Reyes et al., "Silicon as a Microwave Substrate", IEEE MTT–S International Microwave Symposium Digest, vol. 3, May 23–27, 1994, pp. 1759–1762.

Reyes et al., "Microwave Inductors on Silicon Substrates", The 24th European Microwave Conference, Conference Proceedings, vol. 2, 5–8 Sep. 1994, pp. 1042–1047.

B. Viktora, "Uber Die Zeitliche Stabilitat Von Getempertem, Reinem Silizium", Solid–State Electronics, Pergamon Press, vol. 12 (1969), pp. 349–362. (No Translation).

*Primary Examiner*—John Niebling
*Assistant Examiner*—Brian K. Dutton
*Attorney, Agent, or Firm*—Bruce T. Neel

[57] ABSTRACT

A component integration structure (10) for a microwave system includes a silicon substrate (12) having a resistivity greater than about 2,000 ohm-cm. A first die (14) is disposed on the silicon substrate, and a first passive element (20) is disposed on the silicon substrate and electrically coupled to the first die. In addition, a second passive element (22) and a second die (16) may be disposed on the silicon substrate. The second passive element is electrically coupled to the first passive element. An integration method sorts each of a plurality of active devices for placement on either the first die or the substrate depending on which of two different processing flows has the most favorable characteristics for fabricating each particular device.

15 Claims, 1 Drawing Sheet

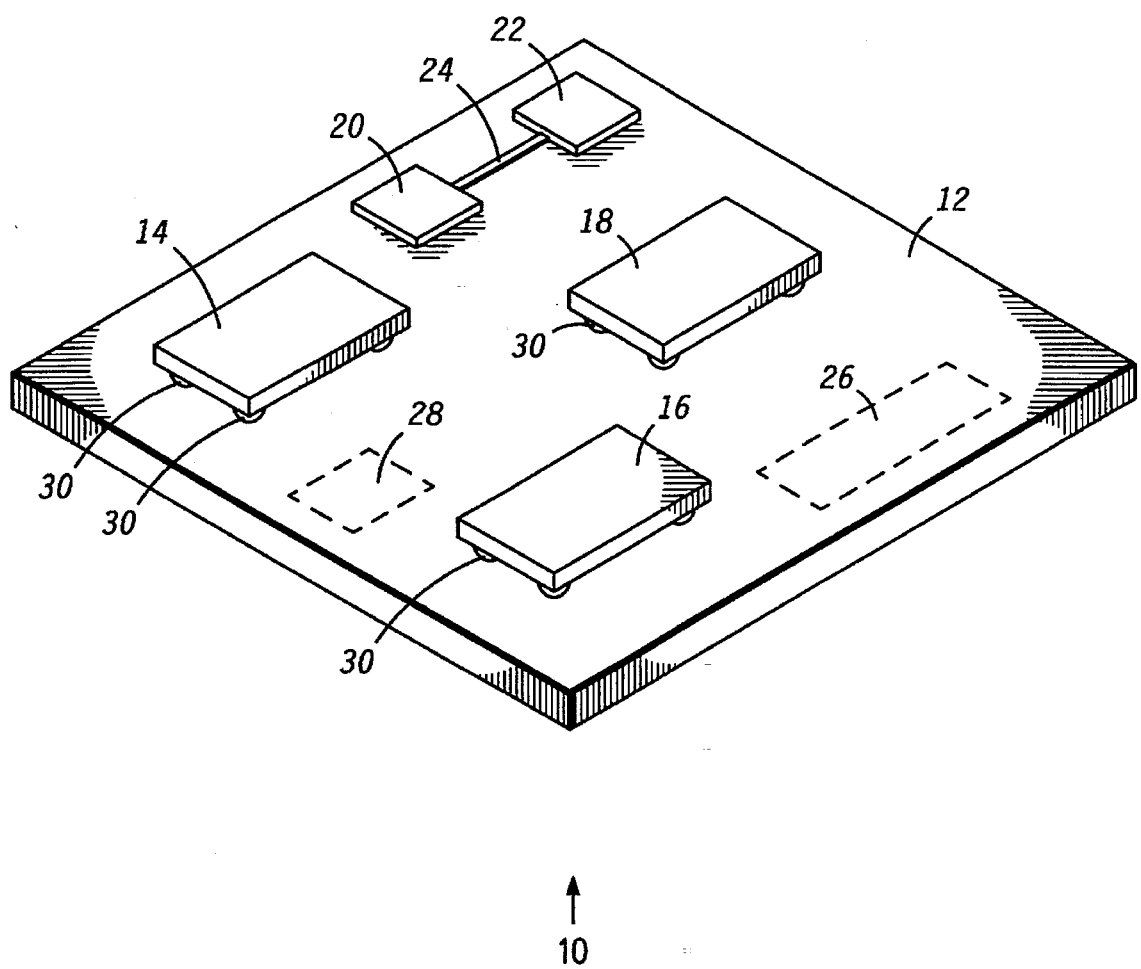

STRUCTURE AND METHOD FOR INTERGRATING MICROWAVE COMPONENTS ON A SUBSTRATE

BACKGROUND OF THE INVENTION

The present invention relates, in general, to microwave systems and, more particularly, to microwave system integration involving devices that are disposed on two or more dies and are electrically coupled.

There is a continuing trend to integrate the various components of a microwave system into a single package. An example of this integration is exhibited by conventional monolithic microwave integrated circuits (MMICs). However, one problem affecting the use of an MMIC is a significant disparity in the fabrication requirements for different types of devices formed on the MMIC. For example, some types of devices on the MMIC only require a low number of processing steps to form, or they are easy to manufacture due to their relatively large geometries. Such devices usually have a high manufacturing yield. One example of such a device is a spiral inductor. In contrast, other types of devices on the MMIC require a relatively large number of processing steps to form or have relatively small geometries, resulting in lower manufacturing yields for these devices. An example of this type of device is a power field effect transistor (FET) having a short gate length.

As a result of the above disparity in manufacturing standards for different devices on an MMIC, the overall yield for the MMIC is disproportionately reduced by the presence of only a small number of low-yielding devices. This is so even though the low-yielding devices typically account for only a small portion of the total layout area of the MMIC. Thus, an MMIC containing predominantly functional devices often must be scrapped solely because one or a few low-yielding types of devices, which occupy only a small portion of the MMIC's total layout area, are found to be non-functional.

Another weakness of prior MMIC integration approaches is their reliance on a gallium arsenide substrate. Gallium arsenide is more difficult to handle and more expensive to process than silicon. Although gallium arsenide has been used widely in the past due to its high resistivity, it would be desirable to form MMIC devices on a silicon substrate due to silicon's low cost and the ability to use well-established silicon processing techniques.

Accordingly, there is a need for a structure and method for integrating microwave devices that avoids the reduction in circuit yield associated with the prior monolithic integration approach and that permits the use of silicon as a substrate for device integration.

BRIEF DESCRIPTION OF THE DRAWING

The sole figure illustrates a perspective view of a component integration structure for a microwave system according to the present invention.

DETAILED DESCRIPTION OF THE DRAWING

Briefly stated, the present invention provides a component integration structure for a microwave system. A first die is disposed on a substrate, which is preferably silicon, having a resistivity greater than about 2,000 ohm-cm. A first passive element of the microwave system is disposed on the silicon substrate and is electrically coupled to the first die. In addition, a second die may be disposed on the silicon substrate and be electrically coupled to a second passive element. The second passive element is typically another element of the microwave system and is likewise disposed on the silicon substrate. Alternatively, in some cases, the second passive element will be the same element as the first passive element. Further, several active devices of the microwave system may be disposed on the substrate and be electrically coupled to the first and second passive elements. The particular distribution used between the substrate and first or second dies for placement of the active and passive elements of the overall system will vary depending, in part, on the specific application intended for the system. This distribution and some of the factors affecting it are discussed in more detail below.

According to one method of the present invention, a plurality of active devices for a microwave system are integrated into a component integration structure by the following steps. First, a high resistivity substrate, which is preferably silicon, is provided. Then, both a first manufacturing process having a first characteristic and a second manufacturing process having a second characteristic are selected. The plurality of active devices are sorted into a first group and a second group wherein the first group corresponds to the first characteristic and the second group corresponds to the second characteristic. A first active device from the first group is formed on the silicon substrate, and a second active device from the second group is formed on a die. Finally, the die is attached to the silicon substrate. In addition, a passive element of the system may be formed on the silicon substrate and electrically coupled to the first active device. In one particular approach, the first characteristic is a first wafer yield, the second characteristic is a second wafer yield, and the first wafer yield is greater than the second wafer yield.

The present invention can be more fully described with reference to the figure, which illustrates a perspective view of a component integration structure 10 for a microwave system. The components of the microwave system are supported by a high resistivity substrate 12, which is preferably silicon. A first die 14, a second die 16, and a third die 18 are disposed on substrate 12. A first passive element 20 and a second passive element 22 have been formed on the surface of substrate 12 and are electrically connected by an interconnect line 24. First die 14 is, for example, electrically coupled to first passive element 20 by an interconnect line (not shown), and second die 16 is, for example, electrically coupled to second passive element 22 by another interconnect line (not shown), as discussed further below. Also, a first circuit region 26 and a second circuit region 28, which each may contain active or passive elements and also be electrically coupled to dies 14, 16, or 18, are located on substrate 12.

Dies 14, 16, and 18 can be attached to substrate 12 by, for example, a conventional flip-chip technique. According to this technique, a plurality of bumps 30 are formed on the side of, for example, first die 14 that contains the predominant number of its active circuit devices. Then, die 14 is flipped over, and bumps 30 are bonded to bonding pads (not shown) that have been previously formed on substrate 12. This bonding uses, for example, conventional reflow or eutectic techniques. Dies 14, 16, and 18 can be formed, for example, using either a gallium arsenide or a silicon die material, and standard bumping and flip-chip bonding methods may be used with either of these types of dies. One example of flip-chip bonding of a gallium arsenide die to a silicon substrate is described by Sakai et al. in "A Novel Millimeter-Wave IC on Si Substrate using Flip-Chip Bonding Technology", IEEE MTT-S International Microwave Symposium Digest, vol. 3, May 23–27, 1994, pp. 1763–1766, which is hereby incorporated by reference in full. As one of skill in the art will appreciate, an underfill material is disposed between the gallium arsenide die and the silicon substrate which is appropriate for accomodating the difference in thermal expansion coefficients between gallium arsenide and silicon.

Although bumps 30 are described above as being formed on dies 14, 16, and 18, one skilled in the art will appreciate that bumps 30 can alternatively be formed on substrate 12 as is known. Further, it is not necessary that a flip-chip technique be used. Dies 14, 16, and 18 can be attached to substrate 12 using other known methods, such as wire-bonding. Also, if desired, dies 14, 16, and 18 can be formed using a high-resistivity silicon substrate as is used for substrate 12.

Substrate 12 preferably has a bulk resistivity of at least about 2,000 ohm-cm, and more preferably greater than about 3,000 ohm-cm. As an example, a high-resistivity n-type silicon substrate having a (100) or (111) crystal orientation can be used. P-type silicon substrates may also be used. A typical bulk resistivity range for a preferred silicon substrate is about 3,000 to 7,000 ohm-cm, with higher bulk resistivities being generally preferred. The use of a high-resistivity silicon substrate is described in greater detail in a pending application titled "Microwave Integrated Circuit Passive Element Structure and Method for Reducing Signal Propagation Losses" by Adolfo Reyes (Ser. No. 08/282,444, filed Jul. 29, 1994), which is hereby incorporated by reference in full.

Although substrate 12 is preferably a silicon substrate, it is believed that the present invention can also be used with other high-resistivity semiconductor substrates. Generally, a suitable alternative substrate will have a bandgap about equal to or greater than that of silicon and will exhibit a high resistivity due to the use of a pure semiconductor material.

In addition to the above, substrate 12 should preferably be formed of a high purity silicon that is uncompensated, which means that no metal atoms have been substituted into the silicon to provide the high-resistivity characteristics. Compensated silicon achieves its high resistivity because compensating metal atoms therein create deep-level impurity traps. Using lower purity, compensated silicon can lead to adverse effects because the compensating metal atoms tend to migrate in the substrate at higher processing temperatures. Such temperatures are required, for example, when forming active devices. Possible adverse effects of this migration include a lowering of bulk resistivity of the substrate and a change in substrate semiconductor type from n-type to p-type, or vice versa.

Passive elements 20 and 22 can be any of a number of microwave circuit components including inductors, capacitors, resistors, and transmission lines. Some examples of suitable passive elements are described further in Reyes, "Microwave Integrated Circuit Passive Element Structure and Method for Reducing Signal Propagation Losses" (application Ser. No. 08/282,444, filed Jul. 29, 1994), Reyes et al., "Silicon as a Microwave Substrate", IEEE MTT-S International Microwave Symposium Digest, vol. 3, May 23–27, 1994, pp. 1759–1762, and Reyes et al., "Microwave Inductors on Silicon Substrates", The 24th European Microwave Conference, Conference Proceedings, vol. 2, 5–8 Sep. 1994, pp. 1042–1047, which are all hereby incorporated by reference in full. Passive elements 20 and 22 typically carry radio frequency signals having a frequency greater than about 500 MHz.

It should be noted that interconnect line 24 is shown in the figure for illustrative purposes only, and one of skill in the art will recognize that a plurality of interconnect lines (not shown) are used to connect dies 14, 16, 18 and passive elements 20 and 22. As mentioned above and by way of example, first die 14 is electrically coupled to first passive element 20 by an interconnect line (not shown), and second die 16 is electrically connected to second passive element 22 by another interconnect line (not shown).

In addition to passive elements 20 and 22, a plurality of active devices (not shown) may be additionally provided within first circuit region 26 or second circuit region 28. Circuit regions 26 and 28 may be either relatively close together or distal from one another and are placed as permitted by the locations of attached dies 14, 16, and 18 and other passive elements on substrate 12. The criteria for selection of those active circuit devices to place on substrate 12 in circuit regions 26 or 28 are discussed further below. Again, one of skill in the art will appreciate that many interconnect lines (not shown) will connect these and other passive and active devices (not shown) on substrate 12 to one another and to attached dies 14, 16, and 18.

In general, according to the integration method of the present invention, those microwave circuit devices, whether active or passive, that exhibit relatively high manufacturing percentage wafer yields, require a relatively low number of processing steps to form, or exhibit a relatively low manufacturing cost per die will be placed on substrate 12. Examples of such devices include most typical passive microwave elements and larger-geometry active devices.

In contrast, those circuit devices that exhibit relatively low manufacturing percentage wafer yields (such as memory integrated circuits (ICs)), require a relatively high number of processing steps to form (such as complex digital ICs), or exhibit a relatively high manufacturing cost per die (such as high-performance microwave devices) will be formed on dies 14, 16, and 18. The choice of which of these dies to use is related to the preferred processing technology for forming a given device.

As a more specific discussion of the integration method according to the present invention, an active device type formed by a process having a characteristically low wafer percentage yield is selected to provide a first group of devices, and a second active device type formed by a process having a relatively higher characteristic wafer percentage yield is selected to provide a second group of devices. Active devices in the first group are formed, for example, on second die 16, and active devices in the second group are formed on substrate 12. Second die 16 is then attached to substrate 12. As a result, the overall yield for all circuit devices formed on integration structure 10 is increased. This is so because the lower yields of the devices selected to be in the first group of devices formed on second die 16 do not lower the wafer yields for those devices in the second group formed on substrate 12. The net result of this approach is a lower total manufacturing cost for integration structure 10 and its system components.

Although the sorting of active devices into first and second groups based on yield has been presented above, one of skill in the art will appreciate that this sorting may also be done for passive devices or be based on other manufacturing characteristics, such as the total number of processing steps required to form a device or the manufacturing cost per die. Further, the method of integration presented above may be applied to the sorting of devices to be formed on either one of first die 14 or second die 16, depending on the selected processing flow that will be used for each die.

As one specific, but non-limiting, example of integration structure 10, first die 14 is a gallium arsenide die having a low noise amplifier, which accommodates signals with frequencies over about 500 MHz, second die 16 is a silicon die having a central processing unit (such as found in a microcontroller having digital devices), and third die 18 is a gallium arsenide die having a power field effect transistor. First circuit region 26 contains a direct current (DC) network and active devices, and second circuit region 28 contains a conventional matching network. A first manufacturing process used to manufacture the devices on substrate 12 is characterized by a relatively high wafer yield, and a second manufacturing process used to manufacture the devices on second die 16 is characterized by a relatively low wafer yield. According to the method of the present invention, the low-yielding devices are formed on second die 16, which is then attached to substrate 12. The formation of passive and active devices using two different manufacturing processes as appropriate for each type of device increases the overall yield of the integrated microwave system.

Consistent with the above method, in general, microwave components that occupy relatively large layout areas such as transmission lines, inductors, capacitors, and resistors are preferably placed on substrate 12. Other components occupying large layout area that may be suitable for placement on substrate 12 include filters, couplers, splitters, and combiners. On the other hand, microprocessors, microcontrollers, memory chips, and small-geometry field effect transistors (for example, having gate widths less than five microns) are preferably formed on one of dies 14, 16, or 18 and then attached to substrate 12.

By now, it should be appreciated that there has been provided a novel integration structure and method for integrating components of a microwave system. This structure and method have the advantage of increasing the overall yield and reducing the overall cost of the system by segregating components onto different dies depending on the processing technology most appropriate for making those components. A further advantage is that the integration of all system components onto structure 10 greatly reduces the number of assembly operations necessary to produce the system. Also, the use of silicon for substrate 12 rather than gallium arsenide is an important factor that reduces the total system cost.

Another advantage achieved by integration structure 10 is improved thermal conductivity. Specifically, because silicon has a thermal conductivity about three times greater than that of gallium arsenide, heat transfer to substrate 12 from passive elements 20 and 22 and the active devices formed in circuit regions 26 and 28 is improved relative to prior MMICs. Also, when active devices are formed on a gallium arsenide die that is attached to substrate 12, heat transfer away from the active devices is improved because bumps 30 provide a highly thermal-conductive path for heat transfer from the active devices on the gallium arsenide die through bumps 30 to substrate 12.

What is claimed is:

1. A method for integrating microwave system components, comprising the steps of:
   providing a silicon substrate having a resistivity greater than about 2,000 ohm-cm and less than about 7,000 ohm-cm;
   forming a passive element on said silicon substrate; and
   attaching a first die to said silicon substrate wherein said first die is electrically coupled to said passive element.
2. The method of claim 1 further comprising the step of attaching a second die to said silicon substrate wherein said first die corresponds to a first manufacturing process and said second die corresponds to a second manufacturing process.
3. A method for integrating microwave system components, comprising the steps of:
   providing a silicon substrate having a resistivity greater than about 2,000 ohm-cm;
   forming a passive element on said silicon substrate; and
   attaching a first die to said silicon substrate wherein said first die is electrically coupled to said passive element wherein said step of attaching includes forming bumps on said first die and bonding said bumps to said silicon substrate using a flip-chip technique.
4. The method of claim 3 further comprising the step of attaching a second die to said silicon substrate wherein said first die corresponds to a first manufacturing process and said second die corresponds to a second manufacturing process.
5. The method of claim 3 wherein said resistivity is between about 3,000 and 7,000 ohm-cm.
6. The method of claim 5 wherein said passive element transmits a signal having a frequency greater than about 500 MHz.
7. The method of claim 6 further comprising the step of attaching a second die to said silicon substrate wherein said first die is a gallium arsenide die and said second die is a silicon die.
8. The method of claim 7 wherein:
   a digital device is disposed on said second die;
   an active device having a gate width greater than five microns is disposed in a first circuit region of said silicon substrate; and
   said active device is electrically coupled to said passive element.
9. A method of integrating a microwave system including a plurality of active devices, comprising the steps of:
   providing a silicon substrate having a resistivity greater than about 2,000 ohm-cm;
   selecting a first manufacturing process having a first characteristic and a second manufacturing process having a second characteristic;
   sorting said plurality of active devices into a first group and a second group wherein said first group corresponds to said first characteristic and said second group corresponds to said second characteristic;
   forming a first active device from said first group on said silicon substrate;
   forming a second active device from said second group on a die; and
   attaching said die to said silicon substrate.
10. The method of claim 9 further comprising the step of forming a passive element on said silicon substrate wherein said passive element is electrically coupled to said first active device.
11. The method of claim 10 wherein said passive element carries a signal having a frequency greater than about 500 MHz.
12. The method of claim 11 wherein said step of attaching includes bonding said die to said silicon substrate using a flip-chip technique.
13. The method of claim 9 wherein said first characteristic is a first wafer yield, said second characteristic is a second wafer yield, and said first wafer yield is greater than said second wafer yield.
14. The method of claim 9 wherein said first characteristic is a first manufacturing cost per die, said second characteristic is a second manufacturing cost per die, and said second manufacturing cost per die is greater than said first manufacturing cost per die.

15. The method of claim 9 wherein said first characteristic is a first total number of processing steps corresponding to said first active device, said second characteristic is a second total number of processing steps corresponding to said second active device, and said second total number of processing steps is greater than said first total number of processing steps.

* * * * *